(12) United States Patent
Hossain et al.

(10) Patent No.: US 9,455,046 B2
(45) Date of Patent: Sep. 27, 2016

(54) ADAPTIVE ANALOG-TO-DIGITAL CONVERSION BASED ON SIGNAL PREDICTION

(71) Applicant: 9011579 CANADA INCORPOREE, Edmonton, Alberta (CA)

(72) Inventors: Masum Hossain, Edmonton, CA (US); Maruf H. Mohammad, Milpitas, CA (US)

(73) Assignee: 9011579 CANADA INCORPOREE, Edmonton (CA)

( * ) Notice: Subject to any disclaimer, the term of this patent is extended or adjusted under 35 U.S.C. 154(b) by 0 days.

(21) Appl. No.: 14/605,835

(22) Filed: Jan. 26, 2015

(65) Prior Publication Data

US 2016/0217872 A1    Jul. 28, 2016

(51) Int. Cl.
*H04L 7/00* (2006.01)
*G11C 27/02* (2006.01)
*H03L 5/00* (2006.01)
*G05F 1/10* (2006.01)
*H03M 1/38* (2006.01)
*H03M 1/12* (2006.01)
*H04L 7/033* (2006.01)
*H04L 25/03* (2006.01)

(52) U.S. Cl.
CPC .............. *G11C 27/02* (2013.01); *G05F 1/10* (2013.01); *H03L 5/00* (2013.01); *H03M 1/124* (2013.01); *H03M 1/38* (2013.01); *H04L 7/0332* (2013.01); *H04L 25/03006* (2013.01)

(58) Field of Classification Search
CPC ... H04L 7/0337; H04L 7/0334; H04L 7/033; H04L 7/0029; H04L 1/0003; H04L 1/0071; H04L 5/0007; H04L 1/0009; H04L 27/0008; H04L 27/2647; H04L 1/20; H04N 5/4401; H04B 1/30; H04B 1/28; H03L 7/091
USPC ................................. 375/355, 354, 316, 295
See application file for complete search history.

(56) References Cited

U.S. PATENT DOCUMENTS

| 2008/0191910 | A1* | 8/2008 | Simpson | H03M 7/165 341/97 |
| 2013/0135128 | A1* | 5/2013 | Davoodabadi | H03M 1/002 341/122 |
| 2015/0002326 | A1* | 1/2015 | Farley | H03M 1/002 341/155 |

* cited by examiner

*Primary Examiner* — Zewdu Kassa
(74) *Attorney, Agent, or Firm* — Park, Vaughan, Fleming & Dowler LLP; Laxman Sahasrabuddhe

(57) ABSTRACT

Methods and apparatuses are described for performing adaptive analog-to-digital conversion and time-to-delay conversion by using signal prediction to adjust reference voltages of adjustable comparators.

20 Claims, 16 Drawing Sheets

Range of the signal value at time $t$ can be predicted based on signal values at $(t-1)$ through $(t-N)$, where $N$ is the memory length of the communication channel

ADAPTIVE ANALOG-TO-DIGITAL CONVERSION BASED ON SIGNAL PREDICTION

TECHNICAL FIELD

This disclosure relates to electronic circuits. Specifically, this disclosure relates to electronic circuits for analog-to-digital conversion (ADC) and time-to-delay conversion (TDC).

BACKGROUND

Related Art

High-speed communication systems often have to combat inter-symbol-interference (ISI) that can severely impact a receiver's capability to recover the transmitted sequence. Usually an equalization technique is employed at the receiver to correct the channel induced interference. The ISI is generally data dependent and can include signal components with contributions based on prior (pre-cursor) and post (post-cursor) received signals. Various techniques exist, both in the literature and practice, to address pre-cursor and post-cursor ISI. Usually performed at the receiver, existing equalization techniques include attempts to undo the channel introduced interference as well as reconstruction of the ISI through detected signals. With the knowledge of the channel, pre-equalization can be applied at the transmitter to cancel the impact of channel at the receiver. Most of these techniques suffer from noise enhancement, error propagation or reduced dynamic range, and generally are not power and space efficient. Moreover, their performance also degrades considerably in high-speed channels, which can incur losses in excess of 25 dB.

While equalization techniques directly impact any receiver's performance in ISI-limited channels, their architecture, functionality and implementation are often dependent on other modules in the receiver. For example, if the equalizer is to be designed in the digital domain, the effective number of bits (ENOB) of the ADC is an important parameter for its performance. However, the ENOB or the signal to noise ratio of the ADC may degrade if the sampling clock has timing variations. In order to maintain timing accuracy, a clock-data recovery (CDR) circuit is imperative in the receiver as well.

Digital realization of the equalizer provides better performance compared to its analog counterpart mostly due to better tunability and implementation issues. However, the performance of digital equalizers directly depends on the number of bits coming out of the ADC. The power and size of an ADC increases exponentially with the number of bits, making the implementation of high-speed ADC with a higher number of bits prohibitive.

Usually flash or pipeline ADCs are used for high-speed applications. While the former uses a bank of comparators that grows exponentially with the desired number of bits, the latter requires complicated logics for time interleaving. Both of these options suffer from power/size inefficiency and may not be suitable for low-power, high-speed applications that require a higher number of bits. FIGS. 1A-1B relate to a conventional flash ADC. In FIG. 1A, input signal 104 is sampled based on clock signal 102. The sampled voltages (e.g., sampled voltage 106) are then provided as an input to a plurality of comparators. In order to achieve N-bit precision, conventional ADCs use $O(2^N)$ comparators whose reference voltages 108 are evenly spread across the dynamic range of input signal 104. FIG. 1B illustrates conventional ADC circuitry. Each comparator in fixed comparator bank 154 receives two inputs: the sampled analog input voltage and a fixed reference voltage. The outputs of the comparators are provided as inputs to thermometer-to-binary converter 152, which outputs an N-bit binary value that corresponds to the sampled analog input voltage. These ADCs consume a lot of power and use up a large amount of chip area because they require $O(2^N)$ comparators.

FIGS. 1C-1D relate to a conventional successive approximation register (SAR) ADC. The circuit shown in FIG. 1C uses only one comparator (as opposed to $O(2^N)$ comparators used in FIG. 1B), but requires multiple clock cycles to perform the conversion. Specifically, the output of the comparator is provided as an input to a successive approximation register (SAR), which converts the sampled analog input voltage ($V_{IN}$) into a digital value by performing a binary search by using a digital to analog (DAC) converter. FIG. 1D illustrates how the reference voltage of the comparator (which is the output of the DAC) converges to the sampled analog input voltage over multiple clock cycles. Specifically, the input signal is first compared to the reference voltage that divides the entire dynamic range in two equal halves. This comparison generates the most significant bit (MSB) as well as selecting the next reference level. This process continues until N bits are generated in N cycles. Note that during these N cycles, the input to the comparator is held at the sampled value even though the input signal is changing. This makes SAR ADC unsuitable for high-speed applications where N additional clock cycles are needed for N bit resolution.

To summarize: in a flash ADC, the comparators are fixed with respect to the incoming signal and resolved N bits in one cycle, while in an SAR ADC the same comparator is updated in a decision-directed manner but requires N additional cycles to converge. There is a long felt need for an ADC that can operate at high speeds but which does not consume a large amount of power and which does not require a large area to implement.

SUMMARY

Some embodiments described herein feature systems and techniques for adjusting reference voltages of adjustable comparators based on signal prediction. Specifically, some embodiments feature an integrated circuit that comprises (1) sample-and-hold circuitry to sample an input signal based on a clock signal, and to output a sampled voltage for at least a holding period, (2) a plurality of adjustable comparators, wherein each adjustable comparator has a respective reference voltage that is adjustable, and wherein each adjustable comparator outputs a result signal based on comparing the sampled voltage with the adjustable comparator's reference voltage, and (3) control-logic circuitry to predict a voltage range of a future sample of the input signal, and to set reference voltages of the plurality of adjustable comparators based on the predicted voltage range of the future sample of the input signal.

Some embodiments comprise a thermometer-to-binary conversion circuitry that outputs a binary value corresponding to the sampled voltage based on result signals outputted by the plurality of adjustable comparators and information about reference voltages of the plurality of adjustable comparators.

DETAILED DESCRIPTION

Some embodiments described herein feature a unified approach to designing and optimizing the ADC, CDR and equalizer by exchanging information among them. The complementary nature of the design offers a wide variety of power/complexity/size trade-offs that can support a broad range of channels in a single receiver realization.

Figure 1A:
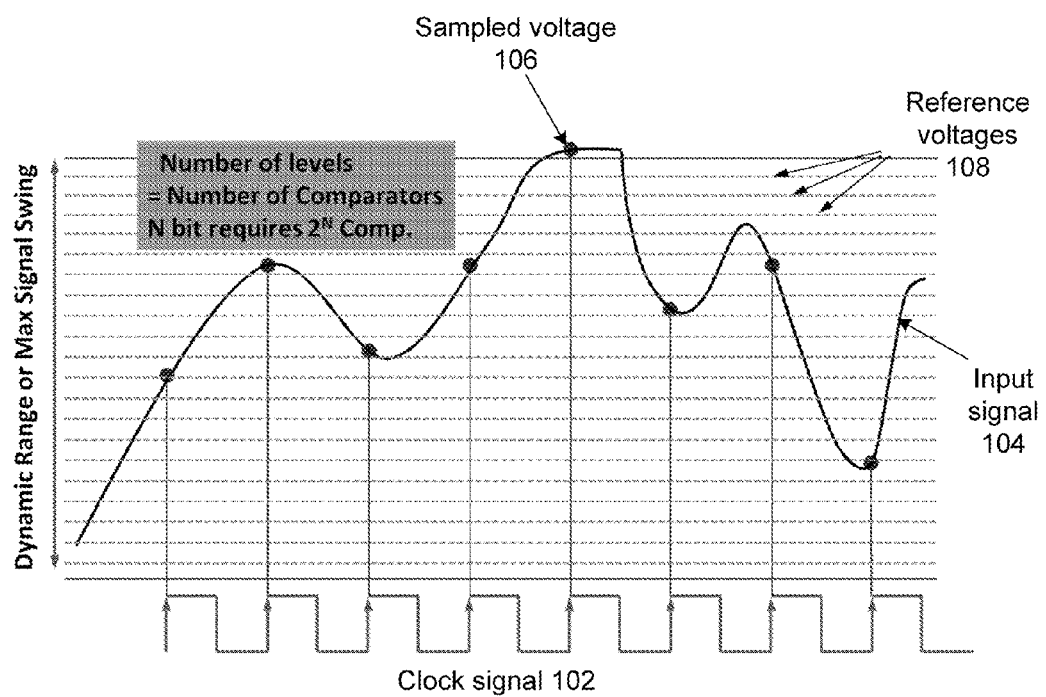
FIGS. 1A-1B illustrate a conventional analog-to-digital converter (ADC).
Figure 1B:
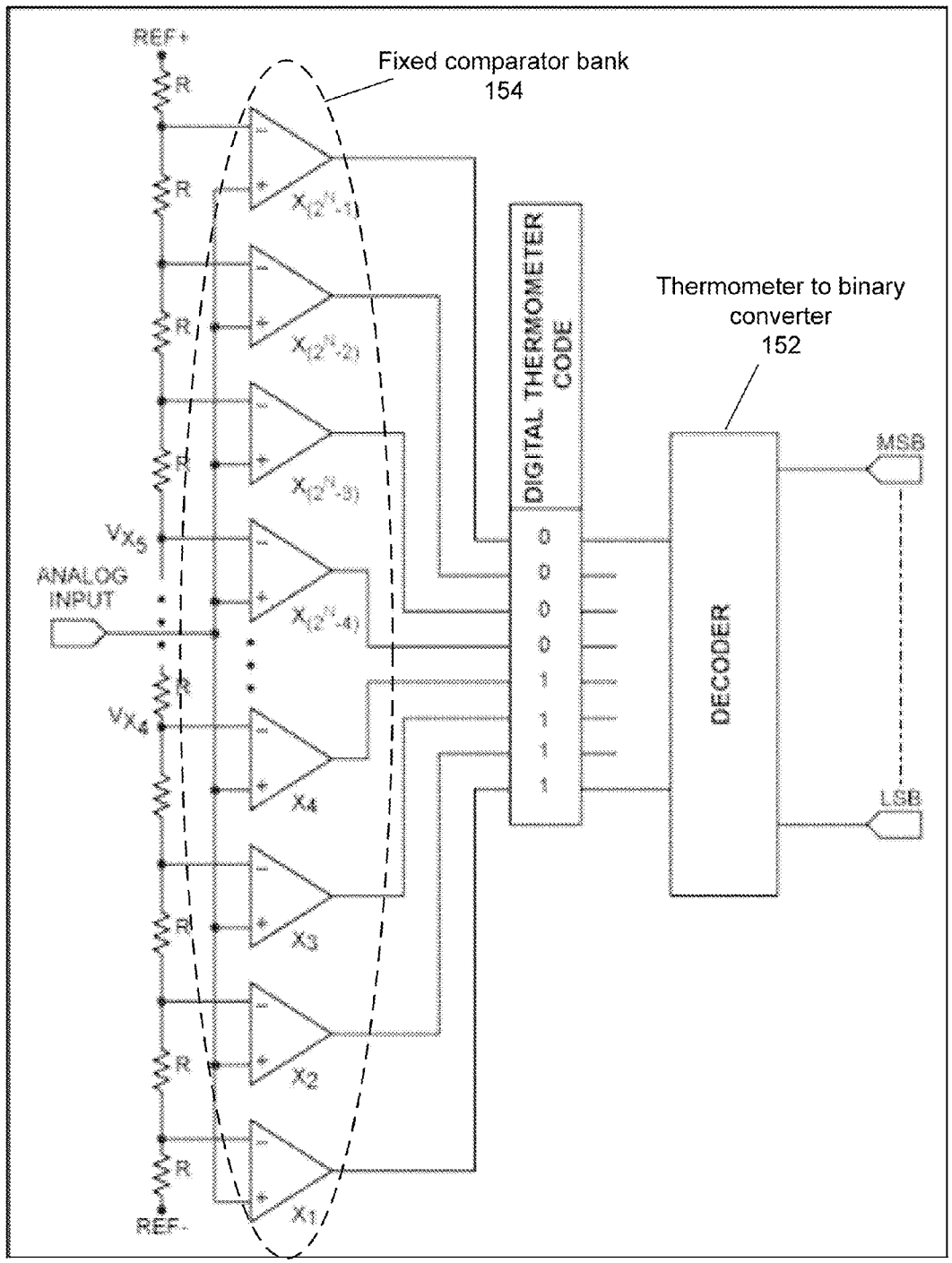
Figure 1C:
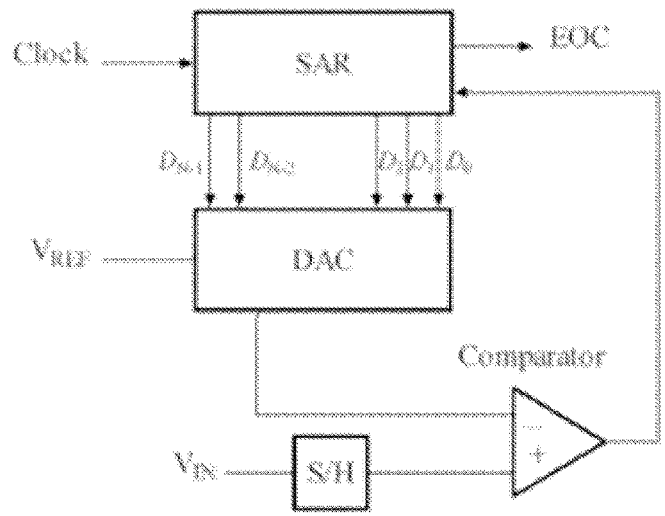
FIGS. 1C-1D illustrate a conventional successive approximation ADC.
Figure 1D:
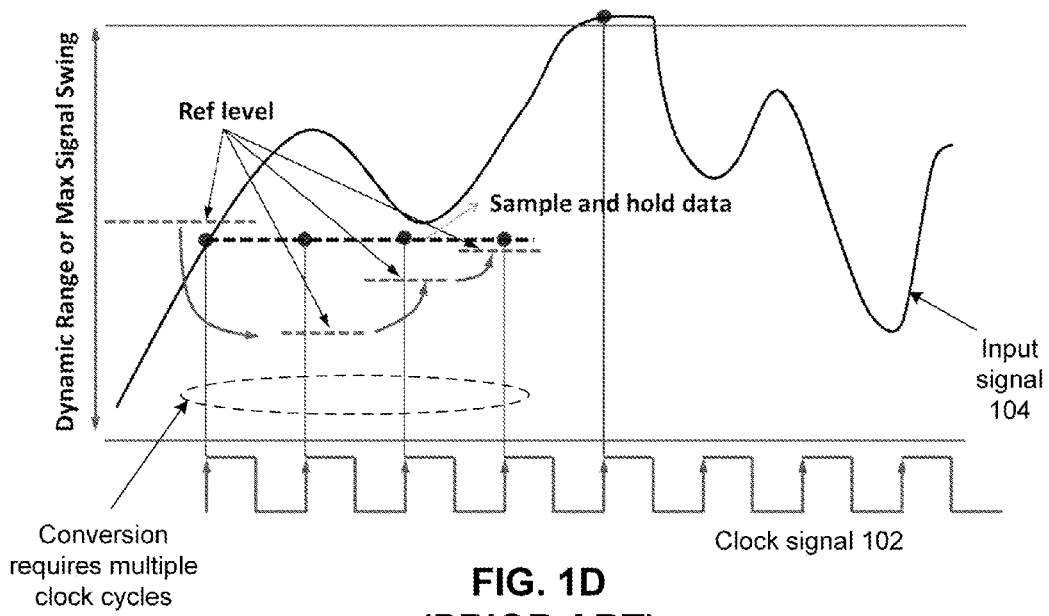
Figure 2A:
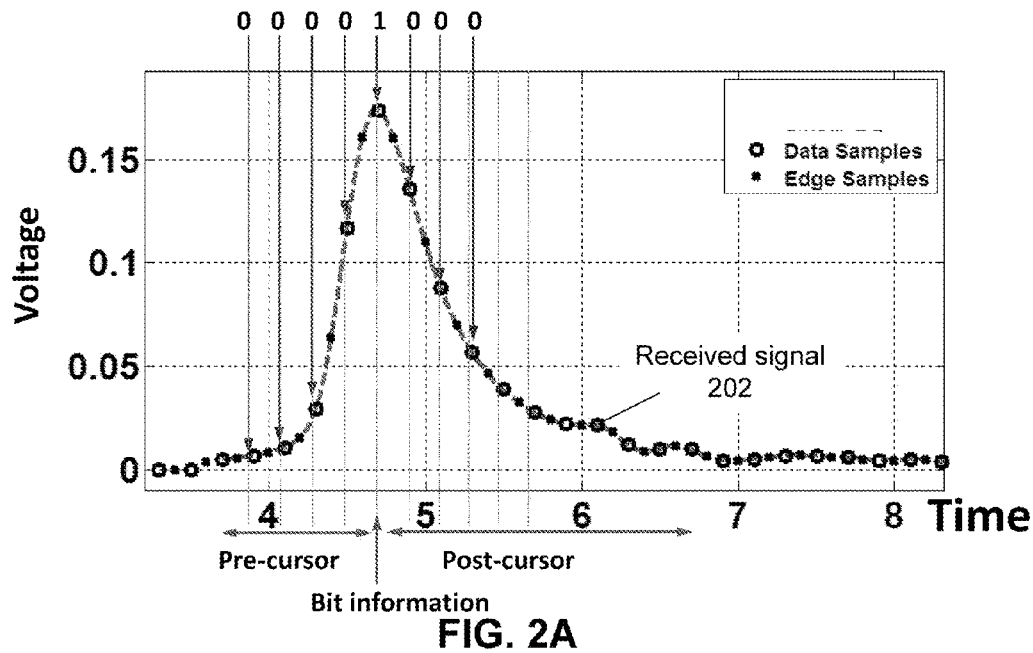
FIG. 2A illustrates an SBR in accordance with some embodiments described herein.

Frequency dependent loss of the channel causes distortion known as ISI. This can be captured in a single bit response (SBR). FIG. 2A illustrates an SBR in accordance with some embodiments described herein. In FIG. 2A, a lone '1' is sent from the transmitter side and signal 202 is received at the receiver. Note that the perfect UI wide pulse is spread out at the receiver end and corrupts the symbols before and after the '1'. In particular, residual voltages on '0' locations prior to the main cursor are known as pre-cursor ISI and residual voltages on '0' locations after the main cursor are known as post-cursor ISI. In simple words, the ISI is the residue of a symbol spreading over neighboring symbols as if the channel holds the memory of the past symbols.

Therefore, the magnitude and the phase of the next received signal is essentially a combination of previous symbols and the next transmitted symbol. Since previous symbols have already been detected at the receiver, the total contribution of the prior transmitted sequence is predictable. However, the next symbol is still unpredictable. By combining the predictable and the unpredictable parts, we can put a bound on the magnitude and the phase of the next received signal within a region in the constellation. For example, the expression $|s(t+1)-s(t)| < h(0)+h(1)-h(-1)+\text{alpha}*\text{sigma}$ can be used to predict the range of the next sample. In this expression, $s(t+1)$ is the next sample at time $t+1$, $s(t)$ is the current sample at time $t$, $|.|$ denotes the magnitude, $h(0), h(1), h(-1)$ denotes the main, first post and first pre-cursor of the channel, respectively, sigma is the noise variance that includes thermal noise, cross talk, etc., and alpha is a scaling factor that is selected based on the implementation and performance requirements.

Figure 2B:
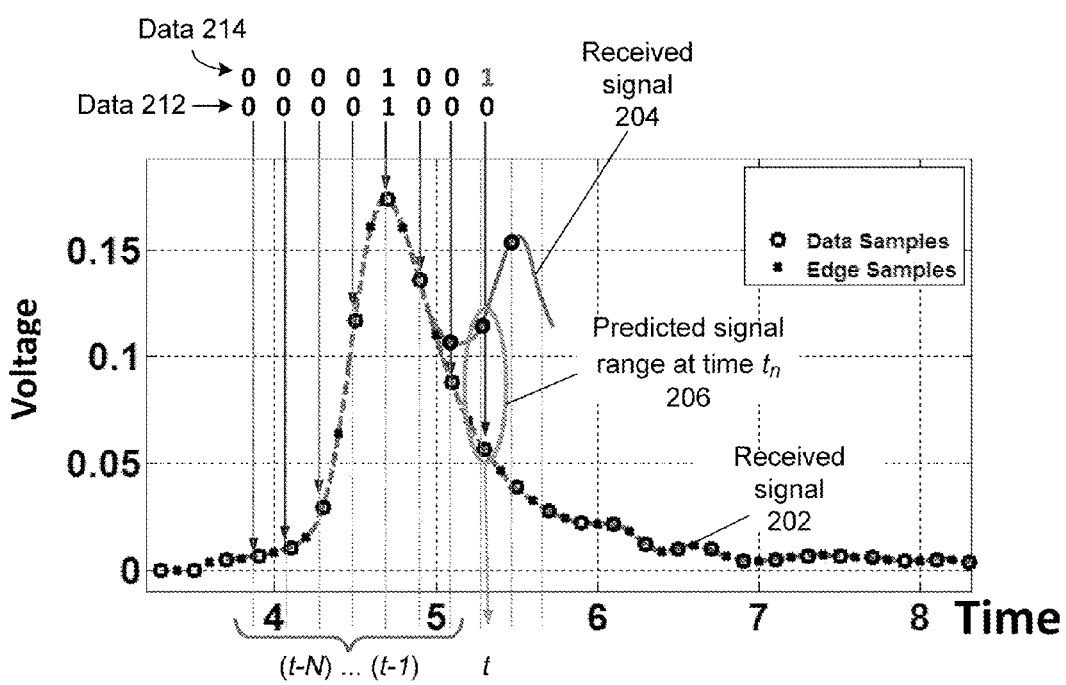
FIGS. 2B-2C illustrate how a predicted signal range can be determined for an input signal in accordance with some embodiments described herein.
Figure 2C:
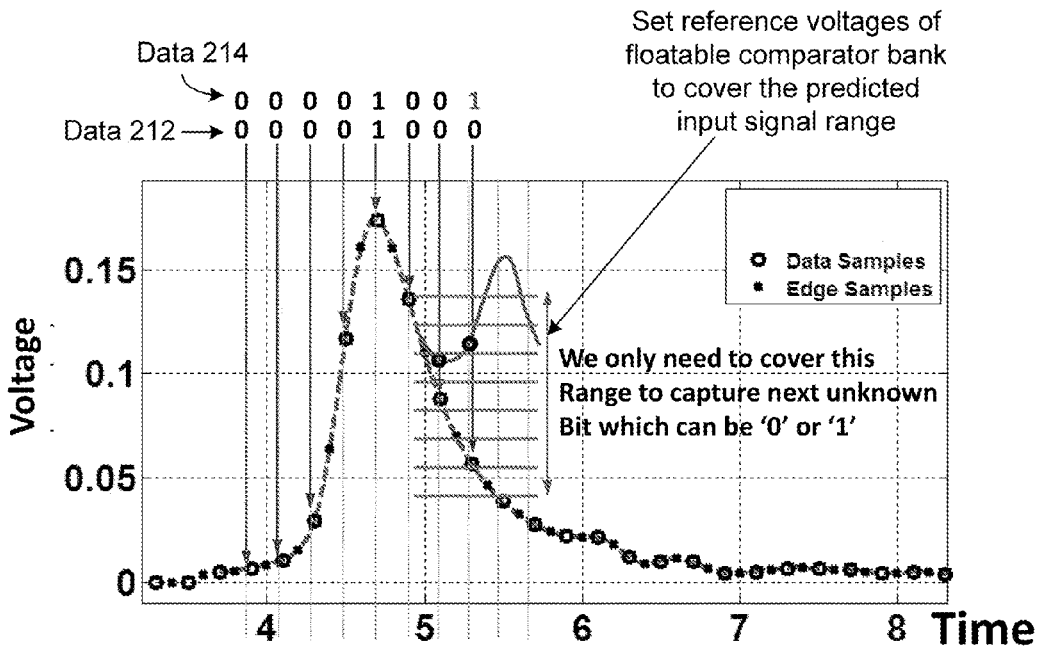

FIGS. 2B-2C illustrate how a predicted signal range can be determined for an input signal in accordance with some embodiments described herein. Received signal 202 corresponds to data 212 being sent from the transmitter, and received signal 204 corresponds to data 214 being sent from the transmitter. Note that the rightmost bit is different in data 212 and 214. Predicted signal range 206 can be determined based on the previous data bits that were received. Some embodiments described herein use the predicted signal range to adjust the reference voltages of comparators so that the comparators are placed in the predicted signal range. By adjusting the reference voltages of the comparators in a predictive manner, we can achieve the dynamic range and resolution of a full blown ADC with fewer comparators.

Figure 3A:
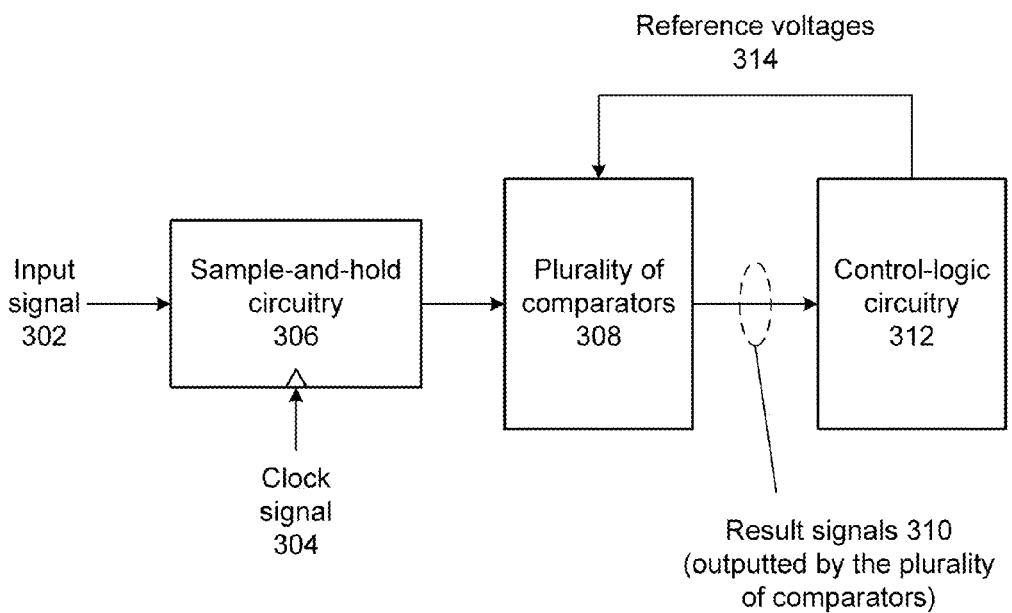
FIG. 3A illustrates circuitry to set reference voltages of comparators based on signal prediction in accordance with some embodiments described herein.

FIG. 3A illustrates circuitry to set reference voltages of comparators based on signal prediction in accordance with some embodiments described herein. Sample-and-hold circuitry 306 can sample input signal 302 based on clock signal 304, and output a sampled voltage for at least a holding period. The sampled voltage can be provided as an input to each comparator in the plurality of comparators 308. Plurality of comparators 308 can include adjustable comparators and optionally fixed comparators. Each comparator has a respective reference voltage, and each comparator can output a result signal based on comparing the sampled voltage with the comparator's reference voltage. Each adjustable comparator has a respective reference voltage that is adjustable, and each fixed comparator has a respective reference voltage that is fixed.

Control-logic circuitry 312 can predict a voltage range of a future sample of the input signal, and can set reference voltages 314 of adjustable comparators in the plurality of comparators 308 based on the predicted voltage range of the future sample of the input signal. In some embodiments, the control-logic circuitry sets the reference voltages of the plurality of adjustable comparators to cover the predicted range of the future sample of the input signal. For example, control-logic circuitry 312 can predict the voltage range of the input signal in the next clock edge of clock signal 304 (as shown in FIG. 2B), and set reference voltages 314 to cover the predicted voltage range of the input signal (as shown in FIG. 2C). Note that the reference voltages of the plurality of comparators can be spread uniformly or non-uniformly over the predicted voltage range of the future sample of the input signal. In some embodiments, the control-logic circuitry can predict the voltage range of the future sample of the input signal based on result signals 310 outputted by the plurality of comparators. Specifically, the control-logic circuitry can predict the voltage range of the future sample of the input signal based on result signals 310 outputted by fixed comparators, adjustable comparators, or both fixed and adjustable comparators.

Figure 3B:
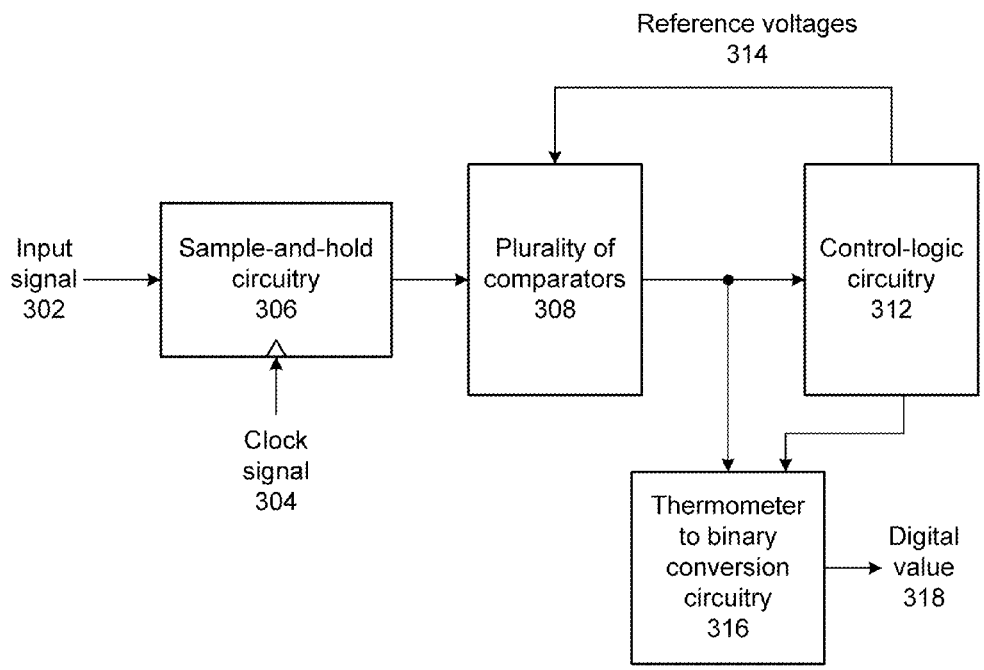
FIG. 3B illustrates an ADC that uses signal prediction in accordance with some embodiments described herein.

FIG. 3B illustrates an ADC that uses signal prediction in accordance with some embodiments described herein. The result signals outputted by the plurality of comparators can be provided as inputs to thermometer to binary conversion circuitry 316. Control-logic circuitry 312 can provide information about the reference voltages 314 (e.g., the voltage range covered by reference voltages 314) to thermometer to binary conversion circuitry 316. Based on these inputs, thermometer to binary conversion circuitry 316 can output digital value 318 that corresponds to the sampled voltage.

Figure 4A:
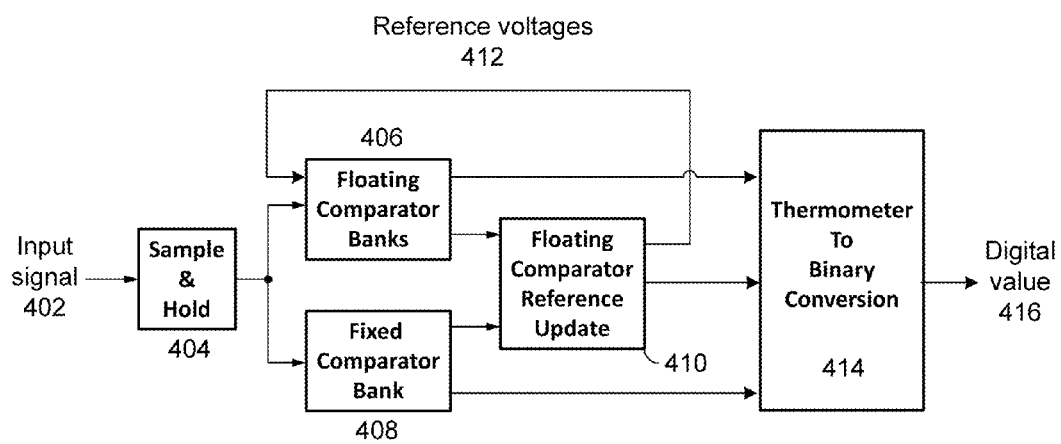
FIG. 4A illustrates an ADC that includes a fixed comparator bank and floating comparator banks in accordance with some embodiments described herein.

FIG. 4A illustrates an ADC that includes a fixed comparator bank and floating comparator banks in accordance with some embodiments described herein. FIG. 4A is a particular implementation of the circuitry shown in FIG. 3B. Sample-and-hold circuitry 404 can sample input signal 402 and output a sampled voltage for at least a holding period. The sampled voltage can be provided to floating comparator banks 406 and fixed comparator bank 408. Each floating comparator bank in floating comparator banks 406 can include a plurality of adjustable comparators, and fixed comparator bank 408 can include a plurality of fixed comparators. The result signals outputted by the floating comparator banks 406 and fixed comparator bank 408 can be provided as input to floating comparator reference update circuitry 410 (this corresponds to control-logic circuitry 312 in FIG. 3B). Floating comparator reference update circuitry 410 can use this information to set reference voltages 412 for adjustable comparators in floating comparator banks 406. The result signals outputted by the floating comparator banks 406 and fixed comparator bank 408, and the voltage range information provided by floating comparator reference update circuitry 410 can be provided as inputs to thermometer to binary conversion circuitry 414, which can then output digital value 416 that corresponds to the sampled voltage. In this embodiment, the fixed comparators can be used to generate the MSBs and floating comparators can be used to generate the LSBs. Therefore, in this embodiment, the fixed and floating comparator outputs can be processed separately and the generated digital bits (i.e., the MSBs and LSBs) can be concatenated to generate the complete digital output.

Figure 4B:
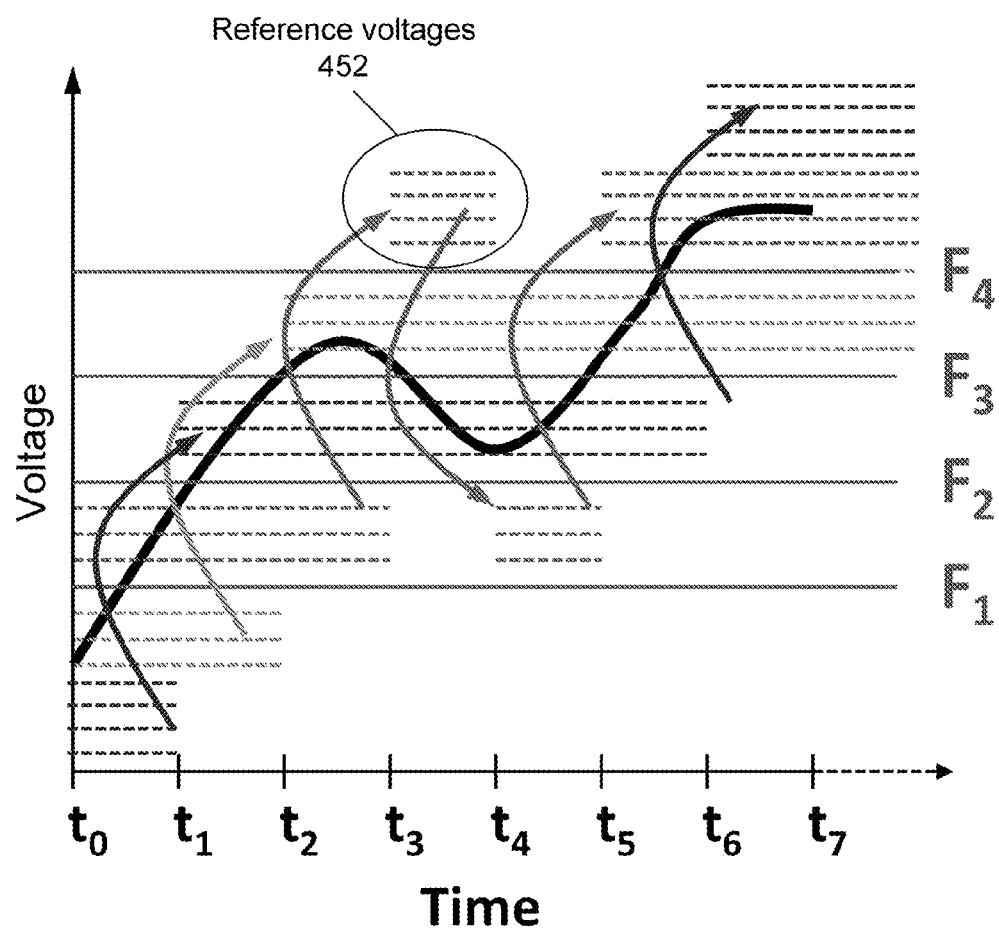
FIG. 4B illustrates how reference voltages for adjustable comparators can change over time in accordance with some embodiments described herein.

FIG. 4B illustrates how reference voltages for adjustable comparators can change over time in accordance with some embodiments described herein. The solid horizontal lines $F_1$-$F_4$ correspond to the reference voltages for four fixed comparators. Note that the fixed comparators (i.e., solid horizontal lines $F_1$-$F_4$) are coarsely spaced and are primarily used to predict the location of the next sample value.

The dashed horizontal lines correspond to the reference voltages for adjustable comparators. In the example shown in FIG. 4B, each floating comparator bank includes four adjustable comparators, and the arrows illustrate how the reference voltages for the adjustable comparators are modified over time. For example, reference voltages 452 of adjustable comparators in a floating comparator bank were reduced at time $t_4$ because the control-logic circuitry predicted that the next sampled voltage would be lower. The example shown in FIG. 4B illustrates how a 2.5× improvement in coverage can be achieved with significantly fewer comparators without sacrificing resolution. Note that this concept can be further extended taking floating comparator outputs along with fixed comparators in the prediction algorithm to achieve further extension of the range.

High-speed serializers-deserializers (SERDES) are often designed to serve many different applications where channel loss can vary from 10 dBs of loss up to 35+dBs of loss. ADC-based receivers are particularly useful for high loss channels that require sophisticated digital equalization, such as maximum likelihood sequence detectors (MLSDs). Since at 35+ dBs of loss signal to noise ratio is very low, the link performance is very sensitive to any additional noise. Therefore, high resolution ADCs are needed in such applications to achieve low quantization noise.

In contrast, low-loss channels often require low power equalization and, as a result, ADC-based solutions are often not considered for such cases. In some embodiments described herein, the same set of comparators can be used to achieve variable resolution ADC. Specifically, in some embodiments described herein, the input signal (e.g., input signal 302 in FIG. 3A) is received over a communication channel, wherein the control-logic circuitry (e.g., control-logic circuitry 312 in FIG. 3A) predicts the voltage range of the future sample of the input signal based on time-domain and/or frequency-domain characteristics of the communication channel.

Figure 5A:
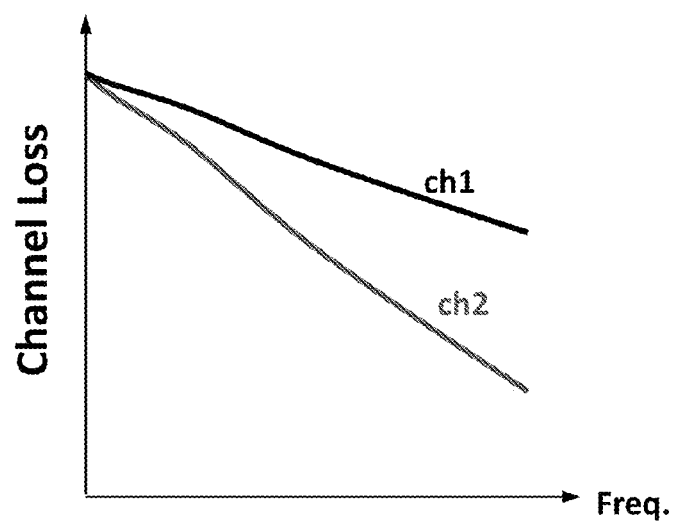
FIGS. 5A-5B show the effect of channel loss on a transmitted signal in accordance with some embodiments described herein.
Figure 5B:
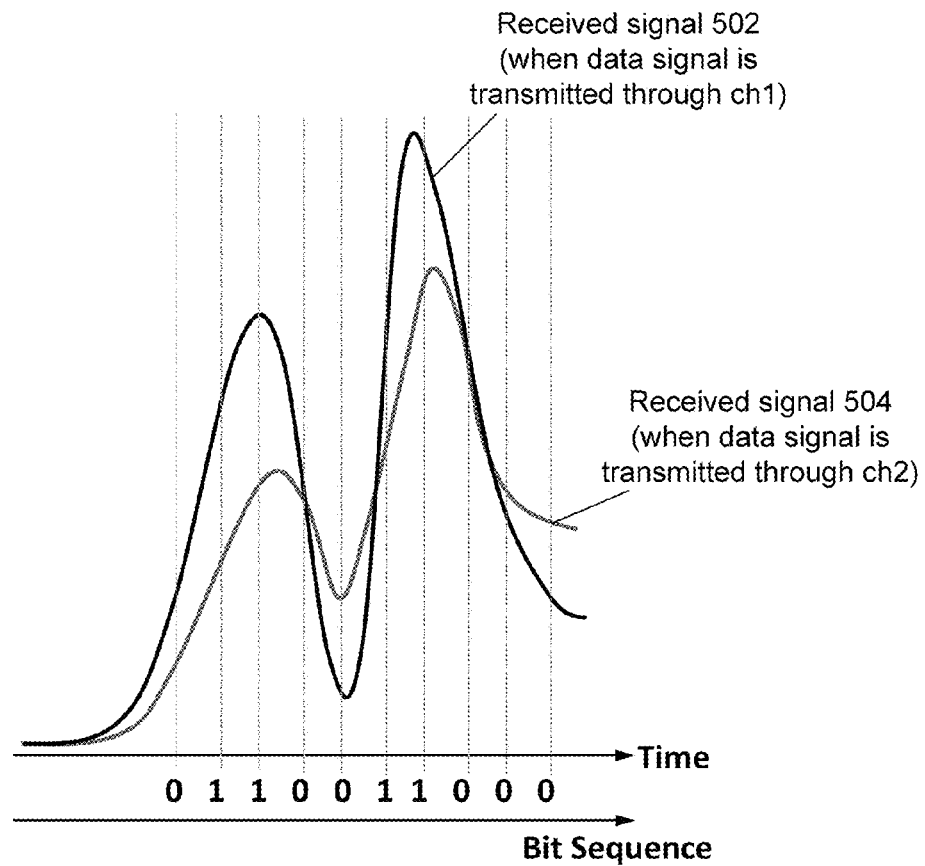

FIGS. 5A-5B show the effect of channel loss on a transmitted signal in accordance with some embodiments described herein. FIG. 5A illustrates the frequency response of a communication channel. For the high loss case (channel "ch2"), the channel introduces more ISI and symbol to symbol signal variation is much less compared to the low loss channel (channel "ch1"). For example, as shown in FIG. 5B, the dynamic range of received signal 502 is greater than the dynamic range of received signal 504. Therefore, in the high loss case, the next received signal amplitude is predictable over a smaller range of voltages. Taking advantage of this observation, some embodiments can set reference voltages of the plurality of adjustable comparators to cover a smaller range to achieve higher resolution when the channel has a high loss. On the other hand, for lower loss channels the correlation between signal samples is reduced due to less ISI, and the embodiments can set the reference voltages to cover a wider range of voltages with the same number of comparators. Consequently, in these embodiments, the ADC resolution degrades and quantization noise increases adaptively with the channel loss characteristics. Since now the channel has less loss, the signal to noise ratio may still be sufficient such that we can achieve the required link performance even with higher quantization noise. However, the thermometer to binary encoder power reduces linearly in the back end to improve the power efficiency of the link. In this manner, channel-adaptive ADC provides a trade-off between resolution and power to meet a target performance.

Figure 6A:
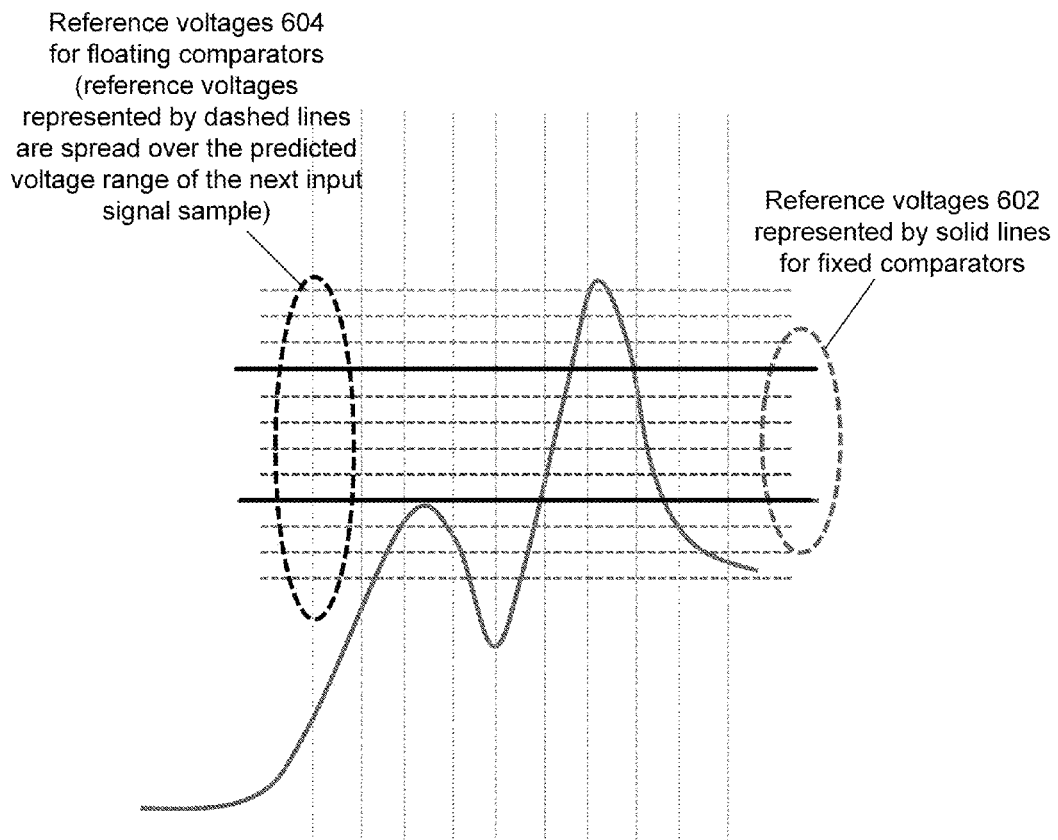
FIGS. 6A-6B illustrate how reference voltages of floating comparators can be set based on channel characteristics in accordance with some embodiments described herein.
Figure 6B:
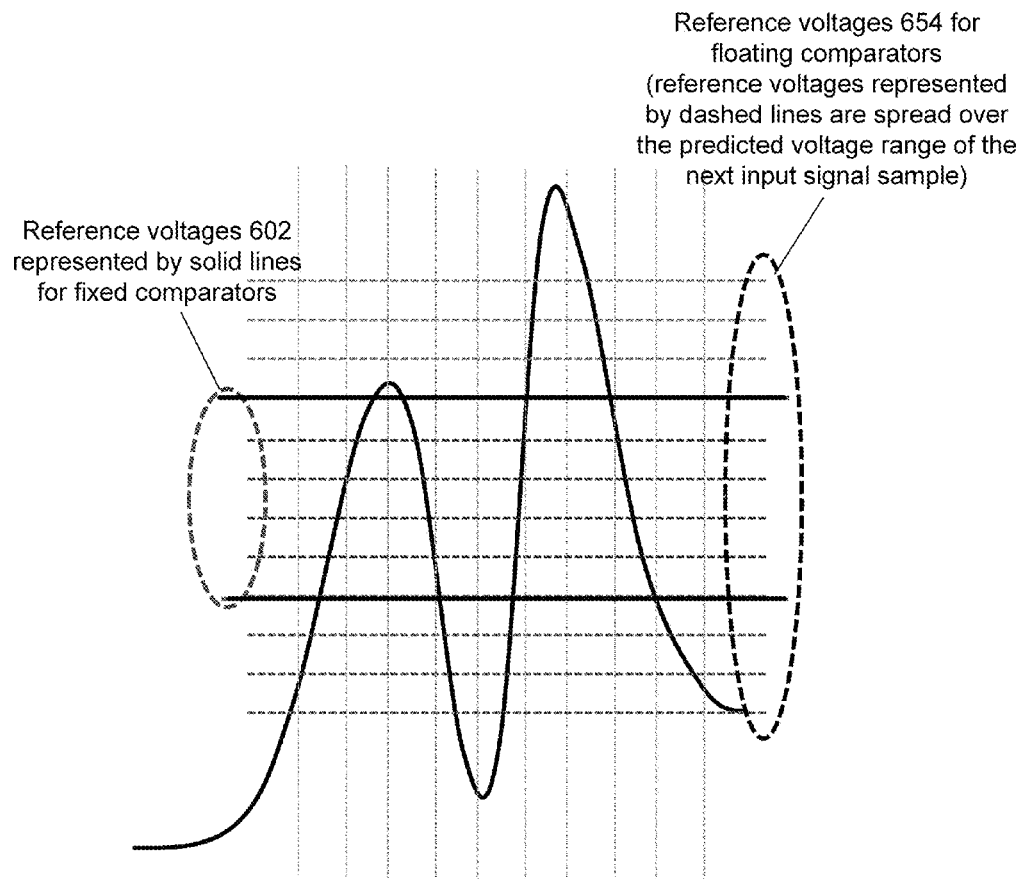

FIGS. 6A-6B illustrate how reference voltages of floating comparators can be set based on channel characteristics in accordance with some embodiments described herein. Each solid horizontal line corresponds to a reference voltage of a fixed comparator, and each dotted horizontal line corresponds to a reference voltage for an adjustable comparator. Reference voltages 602 for the fixed comparators are the same in FIGS. 6A and 6B. However, reference voltages 604 for the floating comparators are spread over a smaller dynamic voltage range in FIG. 6A (this corresponds to a high loss communication channel, e.g., channel "ch2"), whereas reference voltages 654 for the floating comparators are spread over a greater dynamic voltage range in FIG. 6B (this corresponds to a low loss communication channel, e.g., channel "ch1").

The purpose of the phase detector is to provide a timing relationship between the sampling clock and the optimal sampling position in the data eye. Since conventional bang-bang phase detectors give only 'Early' or 'Late' decisions, it can be considered as a 1-bit time to digital converter (TDC).

Although it is possible to complete the timing loop using a 1-bit TDC, the trade-off between the recovered clock jitter and the tracking bandwidth results in a significant timing margin loss. Although multi-bit TDC can potentially improve this situation, their power consumption renders such solutions impractical. However, using the predictive nature of the ADC embodiments described in this disclosure, we can achieve sufficient resolution using only a few comparators. This is achieved by predicting the location of data transition based on the signal amplitude. As a result, the data and edge samplers work in a collaborative manner where placement of the data comparators is predicted based on the edge comparator outputs and vice versa.

Figure 7A:
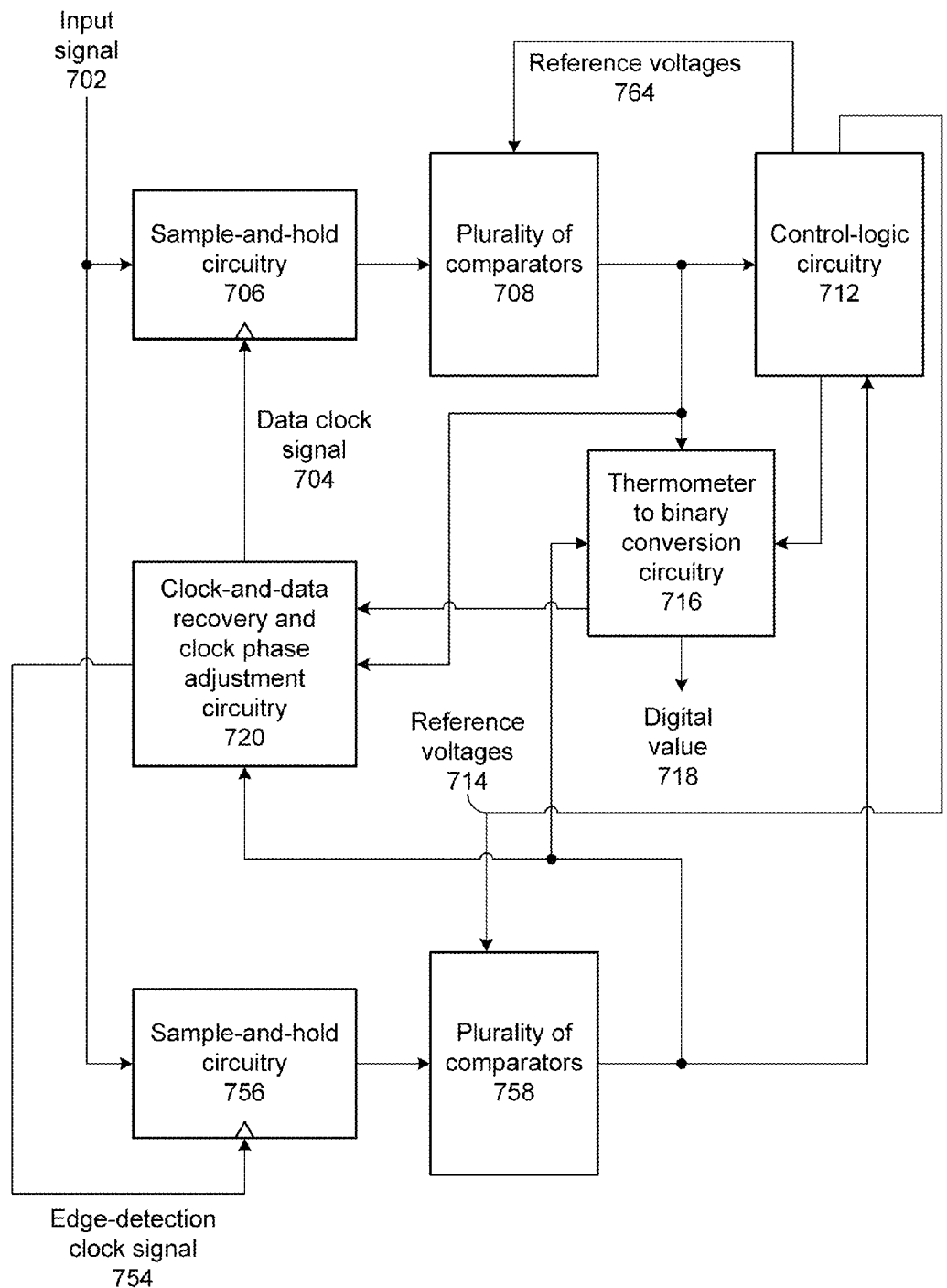
FIG. 7A illustrates how data and edge samplers can work in a collaborative manner to predict the input signal and place adjustable comparators in accordance with some embodiments described herein.

FIG. 7A illustrates how data and edge samplers can work in a collaborative manner to predict the input signal and place adjustable comparators in accordance with some embodiments described herein. The circuit diagram shown in FIG. 7A is for illustration purposes only. Many modifications and variations will be apparent to a person having ordinary skill in the art. Specifically, a given implementation may include fewer or more components than those shown in FIG. 7A. Specifically, some of the blocks in FIG. 7A may be combined or may share circuitry, and other blocks may be split-up into multiple blocks. For example, clock-and-data recovery and clock phase adjustment circuitry 720 may be split-up into multiple blocks (e.g., a block that performs clock-and-data recovery and another block that performs clock phase adjustment).

Sample-and-hold circuitry 706 can sample input signal 702 based on data clock signal 704, and output a sampled voltage for at least a holding period. The sampled voltage can be provided as an input to each comparator in the plurality of comparators 708. Plurality of comparators 708 can include adjustable comparators and optionally fixed comparators. Sample-and-hold circuitry 756 can sample input signal 702 based on edge-detection clock signal 754, and output a sampled voltage for at least a holding period. The sampled voltage can be provided as an input to each comparator in the plurality of comparators 758. Plurality of comparators 758 can include adjustable comparators and optionally fixed comparators.

Each comparator has a respective reference voltage, and each comparator can output a result signal based on comparing the sampled voltage with the comparator's reference voltage. Each adjustable comparator has a respective reference voltage that is adjustable, and each fixed comparator has a respective reference voltage that is fixed.

Control-logic circuitry 712 can predict a voltage range of a future edge sample of the input signal, and set reference voltages 714 of adjustable comparators in the plurality of comparators 758 based on the predicted voltage range of the future edge sample of the input signal. Control-logic circuitry 712 can also predict a voltage range of a future data sample of the input signal, and set reference voltages 764 of adjustable comparators in the plurality of comparators 708 based on the predicted voltage range of the future data sample of the input signal.

Specifically, control circuitry 712 can set the reference voltages of adjustable comparators so that they uniformly or non-uniformly cover the predicted range of the future edge and data samples, respectively, of the input signal. Control circuitry 712 can predict the voltage range of the future edge and data samples based on result signals outputted by fixed comparators, adjustable comparators, or both fixed and adjustable comparators.

In some embodiments, the result signals outputted by the plurality of comparators 708 and the result signals outputted by the plurality of comparators 758 can be provided as inputs to thermometer to binary conversion circuitry 716. Control-logic circuitry 712 can provide information about the reference voltages 764 (e.g., information about the voltage range covered by reference voltages 764) and information about the reference voltages 714 (e.g., information about the voltage range covered by reference voltages 714) to thermometer to binary conversion circuitry 716. Based on these inputs, thermometer to binary conversion circuitry 716 can output digital value 718 that corresponds to the sampled voltage outputted by sample-and-hold circuitry 706 (and optionally also sample-and-hold circuitry 756).

Figure 7B:
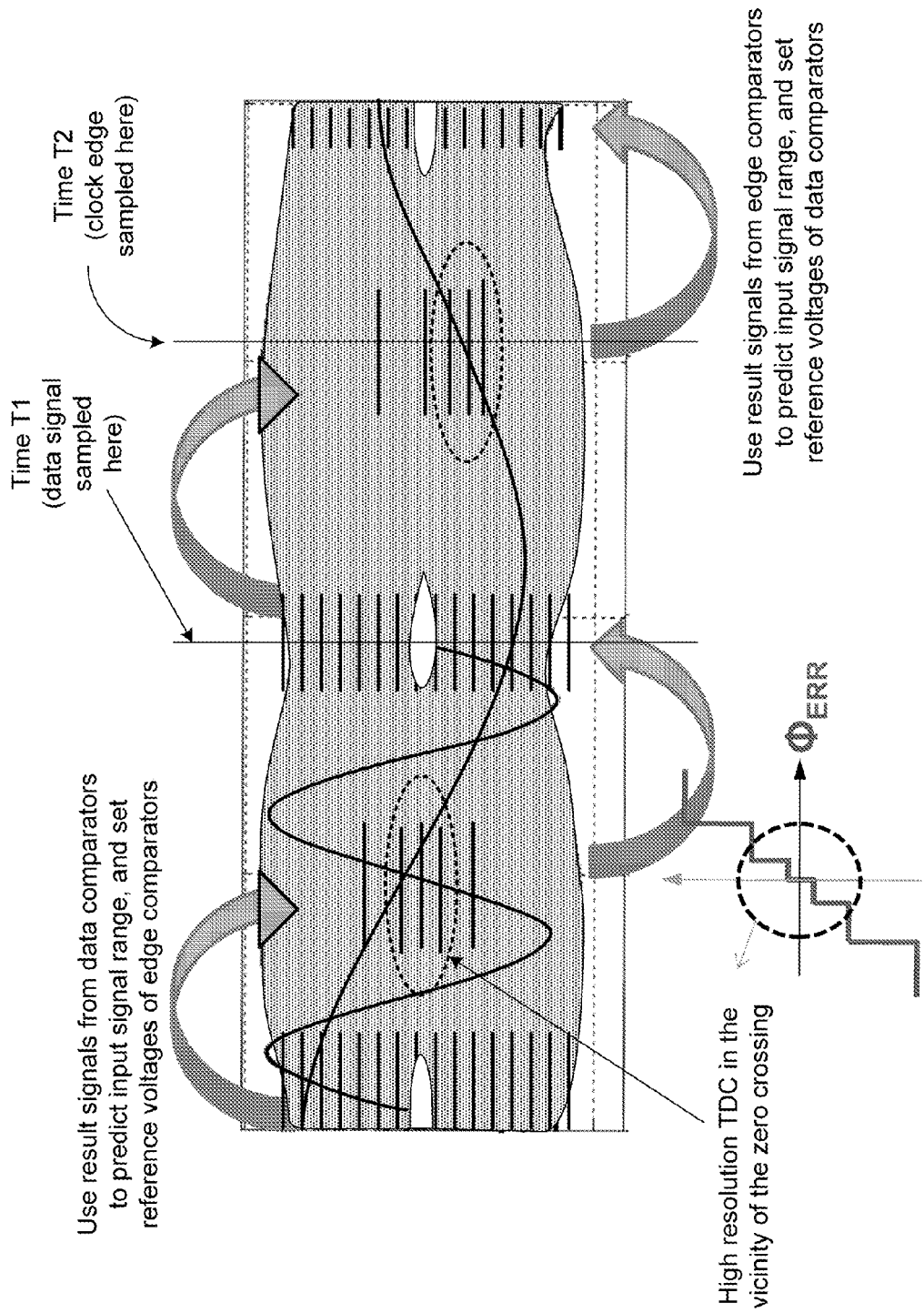
FIG. 7B illustrates an eye diagram corresponding to the circuitry shown in FIG. 7A in accordance with some embodiments described herein.

FIG. 7B illustrates an eye diagram corresponding to the circuitry shown in FIG. 7A in accordance with some embodiments described herein. The short horizontal lines correspond to the reference voltages. In particular, the short horizontal lines at time T1 correspond to the reference voltages of plurality of comparators 708, and the short horizontal lines at time T2 correspond to the reference voltages of plurality of comparators 758. The result signals outputted by the plurality of comparators 708 (which compare the data signal sample with reference voltages) can be used by control-logic circuitry 712 to determine reference voltages for plurality of comparators 758, and conversely the result signals outputted by the plurality of comparators 758 (which compare the clock edge signal sample with reference voltages) can be used by control-logic circuitry 712 to determine reference voltages for plurality of comparators 708.

Note that to achieve low BER after equalization, we need relatively higher resolution (5 to 6 bits) for the data path ADC. On the other hand, the edge path resolution can be relatively relaxed. Also note that higher resolution is needed only around the edge zero crossing to avoid dithering jitter. Therefore, using prediction and non-uniform quantization, it is possible to achieve 4 to 5 bit resolution using 4 to 6 comparators only. Apart from the multi-bit predictive TDC, a unique approach of this scheme is that it ranks and isolates clock edges based on ISI. Specifically, some embodiments described in this disclosure feature an integrated circuit that includes (1) sample-and-hold circuitry to sample an input signal based on a clock signal, and to output a sampled edge voltage for at least a holding period, wherein the sampled edge voltage contains clock edge information that can be used to adjust a phase of the clock signal, (2) a plurality of comparators to output result signals based on comparing the sampled edge voltage with each adjustable comparator's reference voltage, and (3) circuitry to determine an amount of inter-symbol interference in the sampled edge voltage, and to determine whether or not to use the clock edge information contained in the sampled edge voltage to adjust the phase of the clock signal. In these embodiments, the plurality of comparators can include only fixed comparators, only adjustable comparators, or both fixed and adjustable comparators. Note that the embodiments that include only fixed comparators do not include control-logic circuitry to adjust reference voltages.

Figure 7C:
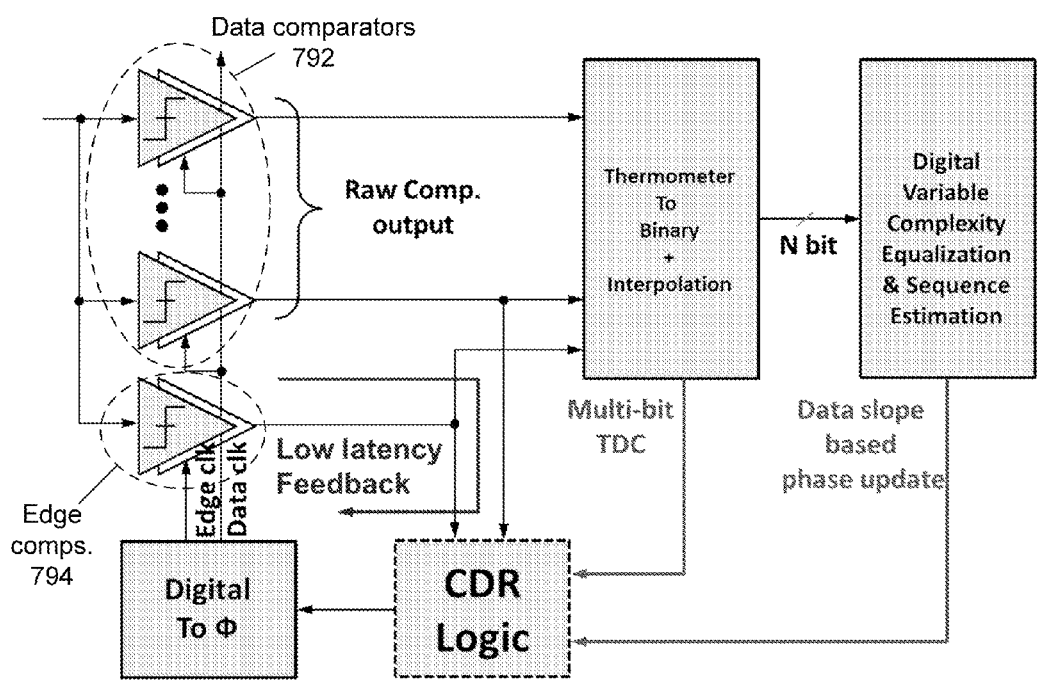
FIG. 7C illustrates how three tracking loops can be implemented in accordance with some embodiments described herein.

Based on the quality of the edge information, three tracking loops can be implemented that can work in a collaborative manner. FIG. 7C illustrates how three tracking loops can be implemented in accordance with some embodiments described herein. The first loop can select the edges with least ISI and can feed the timing information with lowest latency. This is accomplished by combining the output of data comparators 792 with the output of edge comparators 794. The first tracking loop can be very effective when the amount of ISI is low. For example, the zero crossing of the pattern '... 0011 ...' has relatively less ISI and can be filtered by looking at the outputs of the lowest and highest comparators. Since raw comparator outputs are sufficient to filter these edges, no extra latency is added in the feedback loop.

Unfortunately, in a high loss channel there are fewer ISI free edges, and throwing away their timing information may negatively impact CDR tracking capability. Therefore, as shown in FIG. 7C, a second loop can be used that combines raw comparator outputs from data and edge samplers to generate a multi-bit TDC output. The multi-bit TDC output is generated such that the effect of ISI is significantly reduced. This additional loop can allow us to use 80% of the edges even in the presence of high channel loss. CDR tolerance to long sequences of 1s and 0s is often desirable, especially as 8B10B coding overhead is becoming costly. Unfortunately, edge-based CDRs require transition to extract timing information and, without transition, the loop can't track input phase errors. To circumvent such scenarios, a slope-based tracking loop can be used as a third feedback loop, which is also shown in FIG. 7C.

When the three tracking loops are used together, they allow higher tracking bandwidth, lower latency, and tolerance to transition density variation. The multi-bit TDC allows us to achieve higher bandwidth without adding data-dependent jitter by filtering low ISI jitters for timing recovery. In addition, edge samplers are placed predicatively in collaboration with data samplers to achieve higher resolution.

Referring back to FIG. 7A, the result signals outputted by plurality of comparators 708 and 758 can be provided as input to clock-and-data recovery and clock phase adjustment circuitry 720. Clock-and-data recovery and clock phase adjustment circuitry 720 can then generate data clock signal 704 and edge-detection clock signal 754 based on these inputs. In some embodiments, clock-and-data recovery and clock phase adjustment circuitry 720 can also receive information from thermometer to binary conversion circuitry 716, and use the information while performing clock-and-data recovery and phase adjustment.

In some embodiments, clock-and-data recovery and clock phase adjustment circuitry 720 includes phase adjustment circuitry to adjust a phase of the data clock signal and a phase of the edge-detection clock signal based on result signals outputted by the plurality of comparators 708 and 758. The combination of control circuitry 712 and clock-and-data recovery and clock phase adjustment circuitry 720 in FIG. 7A can correspond to the combination of the "Digital to φ," "CDR Logic," "Thermometer-to-binary+Interpolation," and "Digital Variable Complexity Equalization and Sequence Estimation" blocks shown in FIG. 7C.

Figure 8:
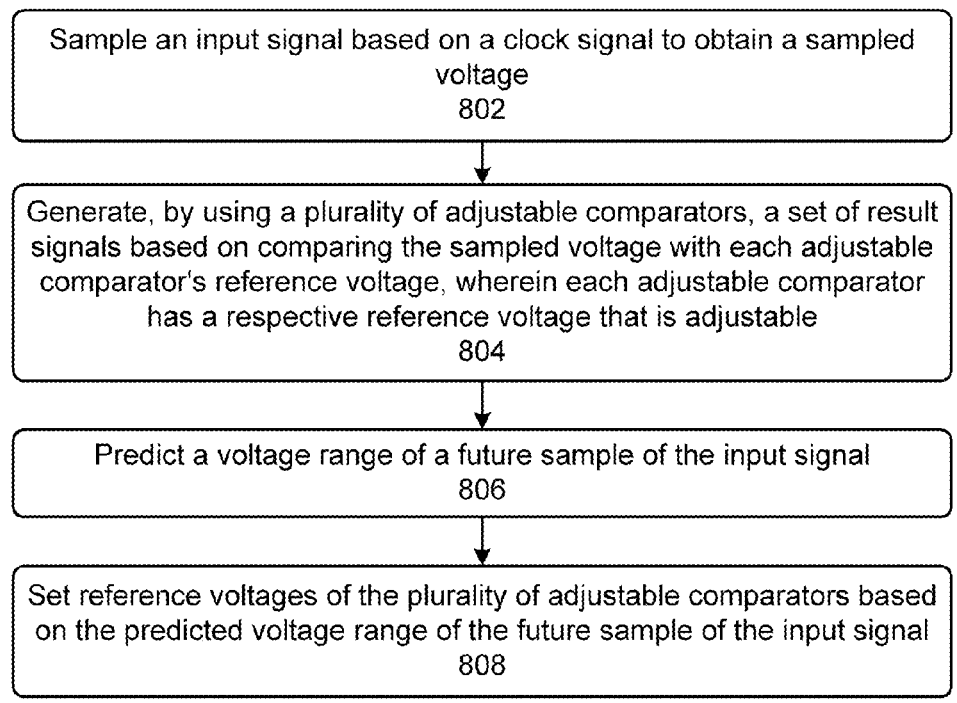
FIG. 8 illustrates a process for using adjustable comparators in an ADC circuit in accordance with some embodiments described herein.

FIG. 8 illustrates a process for using adjustable comparators in an ADC circuit in accordance with some embodiments described herein. The process can begin by sampling an input signal based on a clock signal to obtain a sampled voltage (operation 802). Next, the process can generate, by using a plurality of adjustable comparators, a set of result signals based on comparing the sampled voltage with each adjustable comparator's reference voltage, wherein each adjustable comparator has a respective reference voltage that is adjustable (operation 804). The process can then predict a voltage range of a future sample of the input signal (operation 806). Next, the process can set reference voltages of the plurality of adjustable comparators based on the predicted voltage range of the future sample of the input signal (operation 808).

Figure 9:
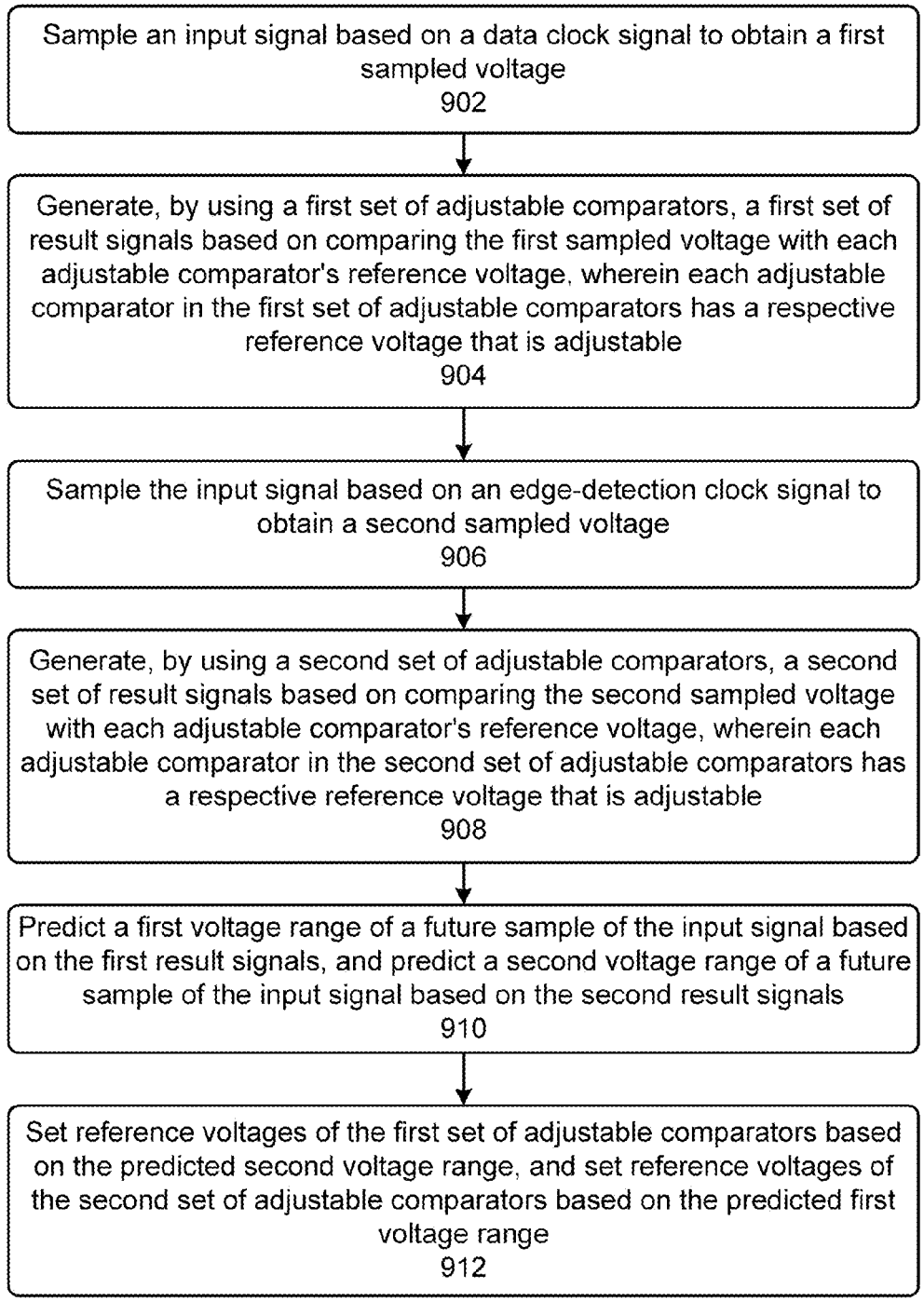
FIG. 9 illustrates a process for using adjustable comparators in an ADC circuit in accordance with some embodiments described herein.

FIG. 9 illustrates a process for using adjustable comparators in an ADC circuit in accordance with some embodiments described herein. The process can begin by sampling an input signal based on a data clock signal to obtain a first sampled voltage (operation 902). Next, the process can generate, by using a first set of adjustable comparators, a first set of result signals based on comparing the first sampled voltage with each adjustable comparator's reference voltage, wherein each adjustable comparator in the first set of adjustable comparators has a respective reference voltage that is adjustable (operation 904). The process can then sample the input signal based on an edge-detection clock signal to obtain a second sampled voltage (operation 906). Next, the process can generate, by using a second set of adjustable comparators, a second set of result signals based on comparing the second sampled voltage with each adjustable comparator's reference voltage, wherein each adjustable comparator in the second set of adjustable comparators has a respective reference voltage that is adjustable (operation 908). The process can then predict a first voltage range of a future sample of the input signal based on the first result signals, and predict a second voltage range of a future sample of the input signal based on the second result signals (operation 910). Next, the process can set reference voltages of the first set of adjustable comparators based on the predicted second voltage range, and set reference voltages of the second set of adjustable comparators based on the predicted first voltage range (operation 912).

Figure 10:
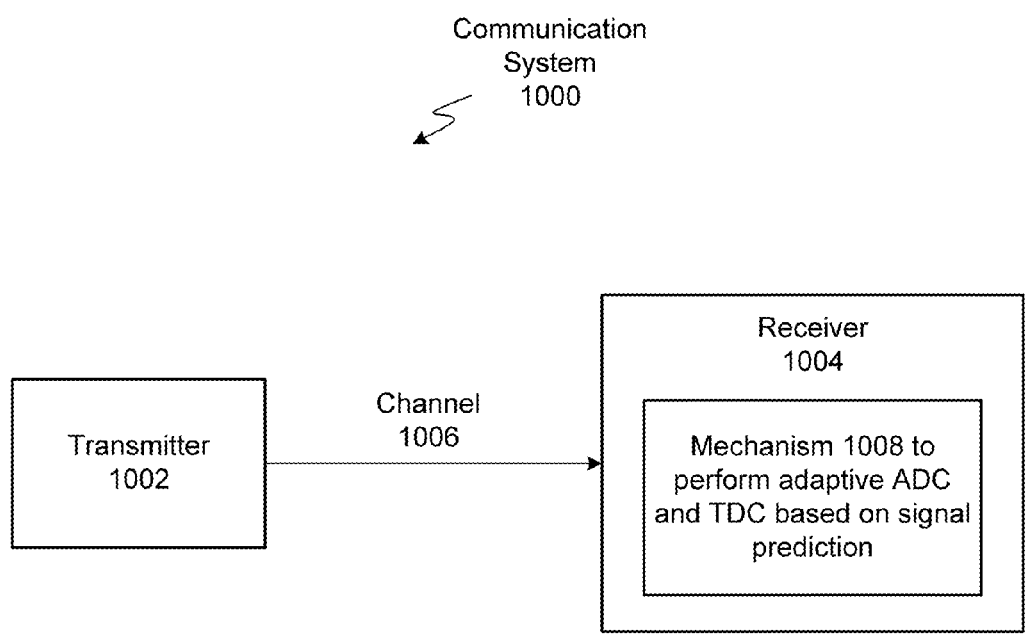
FIG. 10 illustrates a communication system in accordance with some embodiments described herein.

The structures and/or processes that have been implicitly or explicitly described in this disclosure can be embodied in hardware, software, or a combination thereof. Hardware embodiments include, but are not limited to, IC chips, field-programmable gate arrays (FPGAs), systems-on-chip (SoCs), application-specific integrated circuits (ASICs), etc. Specifically, FIG. 10 illustrates a communication system in accordance with some embodiments described herein. Communication system 1000 includes transmitter 1002 that transmits data to receiver 1004 over communication channel 1006. Receiver 1004 can include mechanism 1008 to perform adaptive ADC and TDC based on signal prediction by implementing structures and/or processes that have been implicitly or explicitly described in this disclosure in hardware, software, or a combination thereof.

Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

What is claimed is:
1. An integrated circuit (IC), comprising:
sample-and-hold circuitry to sample an input signal based on a clock signal, and to output a sampled voltage for at least a holding period;
a plurality of adjustable comparators, wherein each adjustable comparator has a respective reference voltage that is independently adjustable, and wherein each adjustable comparator outputs a result signal based on comparing the sampled voltage with the adjustable comparator's reference voltage; and
control-logic circuitry to predict a voltage range of a future sample of the input signal based on only a current sample of the input signal, and to set reference voltages of the plurality of adjustable comparators based on the predicted voltage range of the future sample of the input signal.

2. The IC of claim 1, wherein the control-logic circuitry sets the reference voltages of the plurality of adjustable comparators to cover the predicted voltage range of the future sample of the input signal.

3. The IC of claim 2, wherein the reference voltages of the plurality of adjustable comparators are spread uniformly or non-uniformly over the predicted voltage range of the future sample of the input signal, wherein the predicted voltage range is a constant voltage range that is positioned around the current sample of the input signal.

4. The IC of claim 2, wherein the input signal is received over a communication channel, and wherein the control-logic circuitry predicts the voltage range of the future sample of the input signal based on time-domain and/or frequency-domain characteristics of the communication channel.

5. The IC of claim 4, wherein the predicted voltage range for a high-loss communication channel is smaller than the predicted voltage range for a low-loss communication channel.

6. The IC of claim 1, further comprising a thermometer-to-binary conversion circuitry that outputs a binary value corresponding to the sampled voltage based on result signals outputted by the plurality of adjustable comparators and information about reference voltages of the plurality of adjustable comparators.

7. The IC of claim 1, wherein the control-logic circuitry predicts the voltage range of the future sample of the input signal directly based on result signals outputted by the plurality of adjustable comparators.

8. The IC of claim 1, further comprising a plurality of fixed comparators, wherein each fixed comparator has a respective fixed reference voltage, and wherein each fixed comparator outputs a result signal based on comparing the sampled voltage with the fixed comparator's fixed reference voltage.

9. The IC of claim 8, wherein the control-logic circuitry predicts the voltage range of the future sample of the input signal directly based on result signals outputted by the plurality of fixed comparators.

10. The IC of claim 8, wherein the control-logic circuitry predicts the voltage range of the future sample of the input signal directly based on result signals outputted by the plurality of adjustable comparators and the plurality of fixed comparators.

11. A receiver in a communication system, the receiver comprising:
sample-and-hold circuitry to sample an input signal based on a clock signal, and to output a sampled voltage for at least a holding period;
a plurality of adjustable comparators, wherein each independently adjustable comparator has a respective reference voltage that is adjustable, and wherein each adjustable comparator outputs a result signal based on comparing the sampled voltage with the adjustable comparator's reference voltage; and
control-logic circuitry to predict a voltage range of a future sample of the input signal based on only a current sample of the input signal, and to set reference voltages of the plurality of adjustable comparators based on the predicted voltage range of the future sample of the input signal.

12. The receiver of claim 11, wherein the control-logic circuitry sets the reference voltages of the plurality of adjustable comparators to cover the predicted voltage range of the future sample of the input signal, wherein the reference voltages of the plurality of adjustable comparators are spread uniformly or non-uniformly over the predicted voltage range of the future sample of the input signal, and wherein the predicted voltage range is a constant voltage range that is positioned around the current sample of the input signal.

13. The receiver of claim 12, wherein the input signal is received over a communication channel, and wherein the control-logic circuitry predicts the voltage range of the future sample of the input signal based on time-domain and/or frequency-domain characteristics of the communication channel.

14. The receiver of claim 13, wherein the predicted voltage range for a high-loss communication channel is smaller than the predicted voltage range for a low-loss communication channel.

15. The receiver of claim 11, further comprising a thermometer-to-binary conversion circuitry that outputs a binary value corresponding to the sampled voltage based on result signals outputted by the plurality of adjustable comparators and information about reference voltages of the plurality of adjustable comparators.

16. The receiver of claim 11, wherein the control-logic circuitry predicts the voltage range of the future sample of the input signal directly based on result signals outputted by the plurality of adjustable comparators.

17. The receiver of claim 11, further comprising a plurality of fixed comparators, wherein each fixed comparator has a respective fixed reference voltage, and wherein each fixed comparator outputs a result signal based on comparing the sampled voltage with the fixed comparator's fixed reference voltage.

18. The receiver of claim 17, wherein the control-logic circuitry predicts the voltage range of the future sample of the input signal directly based on result signals outputted by the plurality of fixed comparators.

19. The receiver of claim 17, wherein the control-logic circuitry predicts the voltage range of the future sample of the input signal directly based on result signals outputted by the plurality of adjustable comparators and the plurality of fixed comparators.

20. A method, comprising:
sampling an input based on a clock signal to obtain a sampled voltage;
generating, by using a plurality of adjustable comparators, a set of result signals based on comparing the sampled voltage with each adjustable comparator's reference voltage, wherein each independently adjustable comparator has a respective reference voltage that is adjustable;
predicting a voltage range of a future sample of the input signal based on only a current sample of the input signal, wherein the predicted voltage range is a constant voltage range that is positioned around the current sample of the input signal; and
setting reference voltages of the plurality of adjustable comparators based on the predicted voltage range of the future sample of the input signal.

* * * * *